(12) United States Patent
Harasaki

(10) Patent No.: US 10,571,927 B2
(45) Date of Patent: Feb. 25, 2020

(54) TRANSPORT SYSTEM AND TRANSPORT METHOD

(71) Applicant: MURATA MACHINERY, LTD., Kyoto-shi, Kyoto (JP)

(72) Inventor: Kazumi Harasaki, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 26 days.

(21) Appl. No.: 15/778,661

(22) PCT Filed: Oct. 19, 2016

(86) PCT No.: PCT/JP2016/080976
§ 371 (c)(1),
(2) Date: May 24, 2018

(87) PCT Pub. No.: WO2017/098813
PCT Pub. Date: Jun. 15, 2017

(65) Prior Publication Data
US 2018/0348778 A1 Dec. 6, 2018

(30) Foreign Application Priority Data
Dec. 9, 2015 (JP) .................................. 2015-240044

(51) Int. Cl.
*G05D 1/12* (2006.01)
*H01L 21/67* (2006.01)
*H01L 21/677* (2006.01)
*G05D 1/02* (2020.01)

(52) U.S. Cl.
CPC ..... *G05D 1/0225* (2013.01); *H01L 21/67276* (2013.01); *H01L 21/67727* (2013.01);
(Continued)

(58) Field of Classification Search
CPC ......... G04D 1/0225; G04D 2201/0213; G04D 2201/0216; B65G 43/00; H01L 21/67276;
(Continued)

(56) References Cited
U.S. PATENT DOCUMENTS 8,915,690 B2 * 12/2014 Ota .................... H01L 21/67733
414/275
2008/0063496 A1 * 3/2008 Bufano ............. H01L 21/67017
414/331.01
(Continued)

FOREIGN PATENT DOCUMENTS

JP 2000-339027 A 12/2000
JP 2001-034342 A 2/2001
(Continued)

OTHER PUBLICATIONS

Official Communication issued in International Patent Application No. PCT/JP2016/080976, dated Nov. 22, 2016.
English translation of Official Communication issued in International Patent Application No. PCT/JP2016/080976, dated Jun. 21, 2018.

*Primary Examiner* — Marthe Y Marc-Coleman
(74) *Attorney, Agent, or Firm* — Keating & Bennett, LLP

(57) ABSTRACT

A track in a transport system includes a standby section associated with a certain processing apparatus to allow a transport vehicle to wait. When determining a transport request to transport a FOUP to a load port of the certain processing apparatus exists, the controller allocates, to the transport vehicle, a first transport command to transport the FOUP to the standby section. When reaching the standby section, the transport vehicle waits while holding the FOUP. Subsequently, when determining that the FOUP is transportable to the load port of the certain processing apparatus, the controller allocates, to the transport vehicle, a second transport command to transport the FOUP to the load port of the certain processing apparatus.

7 Claims, 10 Drawing Sheets

(52) U.S. Cl.
CPC .. *H01L 21/67742* (2013.01); *H01L 21/67745* (2013.01); *H01L 21/67769* (2013.01); *G05D 2201/0213* (2013.01); *G05D 2201/0216* (2013.01)

(58) Field of Classification Search
CPC ......... H01L 21/67727; H01L 21/67742; H01L 21/67745; H01L 21/67769
USPC .......................................................... 701/25
See application file for complete search history.

(56) References Cited

U.S. PATENT DOCUMENTS

2012/0114453 A1* 5/2012 Ota ...................... B65G 1/0457
414/281
2014/0297017 A1 10/2014 Mizutani et al.

FOREIGN PATENT DOCUMENTS

| | | | |
|---|---|---|---|
| JP | 2001032342 A * | 2/2001 | |
| JP | 4265462 B2 | 5/2009 | |
| JP | 2010-067146 A | 3/2010 | |
| JP | 2013-125788 A | 6/2013 | |
| JP | 5309814 B2 | 10/2013 | |

* cited by examiner

TRANSPORT SYSTEM AND TRANSPORT METHOD

BACKGROUND OF THE INVENTION

1. Field of the Invention

The present disclosure relates to a transport system and a transport method.

2. Description of the Related Art

A known example of a transport system applied to a semiconductor fabrication plant includes a track, a plurality of transport vehicles traveling along the track to transport an object to load ports of a plurality of processing apparatuses, and a controller communicating with each of the transport vehicles and controlling the operation of each of the transport vehicles (for example, see Japanese Unexamined Patent Publication No. 2000-339027).

In the transport system as described above, when there exists a transport request to transport an object to a load port in a situation where an object is not transportable to the load port, the controller allocates, to a transport vehicle, a transport command to transport the object to a storage shelf or the like for temporarily storing an object. Subsequently, when the situation changes so that an object is transportable to the load port, the controller allocates, to one of the transport vehicles, a transport command to transport the object to the load port from the storage shelf or the like.

Specifically, when an object temporarily stored in a storage shelf or the like is to be transported from the storage shelf or the like to the load port, the controller detects a transport vehicle that can transport the object and allocates, to the detected transport vehicle, a transport command to transport the object from the storage shelf or the like to the load port. The transport vehicle to which the transport command is allocated picks up the object temporarily stored in the storage shelf or the like, transports the object to the load port, and unloads the object. This operation takes time. There is, therefore, a limit in reducing the time taken to unload the object to a load port after the situation changes so that the object is transportable to the load port.

In particular, when the distance between the storage shelf or the like and the load port is long, the time required for the transport vehicle to pick up the object temporarily stored in the storage shelf or the like, transport the object to the load port, and unload the object is long. As a result, for example, the operating rate may be reduced in a certain processing apparatus, such as a processing apparatus with high processing speed.

SUMMARY OF THE INVENTION

Preferred embodiments of the present invention provide transport systems and transport methods, in which a reduction in an operating rate of a processing apparatus is decreased or prevented.

A transport system according to a preferred embodiment of the present invention includes a track, a plurality of transport vehicles to travel along the track and transport an object to a load port of each of a plurality of processing apparatuses, and a controller configured or programmed to communicate with each of the transport vehicles and control operation of each of the transport vehicles. The track is provided with a standby section associated with a certain one of the plurality of processing apparatuses to allow the transport vehicle to wait. When the controller determines that there exists a transport request to transport the object to a load port of the certain one of the plurality of processing apparatuses, the controller allocates, to the transport vehicle, a first transport command to transport the object to the standby section. When reaching the standby section, the transport vehicle to which the first transport command has been allocated waits in the standby section while holding the object. When the controller determines that the object is transportable to the load port of the certain processing apparatus, after allocating the first transport command to the transport vehicle, the controller allocates, to the transport vehicle to which the first transport command has been allocated, a second transport command to transport the object to the load port of the certain processing apparatus.

In this transport system, even if the object is not transportable to the load port of the certain processing apparatus, the transport vehicle picks up the object and starts travelling toward the standby section associated with the certain processing apparatus. When the situation changes so that the object is transportable to the load port of the certain processing apparatus, the transport vehicle travelling toward the standby section or the transport vehicle reaching the standby section and waiting while holding the object is able to immediately transport the object to the load port of the certain processing apparatus without the need for performing an operation, such as picking-up, again. This configuration decreases or prevents a reduction in an operating rate of the certain processing apparatus.

In a transport system according to a preferred embodiment of the present invention, the transport vehicle may travel along the track in one direction, and the standby section may be connected in parallel with a second travel section continuous to an upstream side of a first travel section including a position to transfer the object to the load port of the certain processing apparatus. This configuration enables the transport vehicle to wait in the standby section without interrupting travel of the transport vehicle from the second travel section to the first travel section.

In a transport system according to a preferred embodiment of the present invention, the first travel section may be provided for a plurality of the certain processing apparatuses. In this configuration, since one standby section is associated with a plurality of certain processing apparatuses, the area of the space necessary to provide the standby section is able to be reduced.

In a transport system according to a preferred embodiment of the present invention, when the controller determines that a standby section-withdrawal condition is satisfied, the controller may allocate, to the transport vehicle to which the first transport command has been allocated, a third transport command to transport the object to a predetermined destination. For example, this configuration is able to prevent the transport vehicle from staying in the standby section due to some error occurring in the certain processing apparatus.

In a transport system according to a preferred embodiment of the present invention, when the controller determines, as the standby section-withdrawal condition, that a predetermined time or longer has elapsed since the transport vehicle to which the first transport command has been allocated reaches the standby section, the controller may allocate the third transport command to the transport vehicle to which the first transport command has been allocated. For example, this configuration is able to prevent the transport vehicle from staying in the standby section due to some error occurring in the certain processing apparatus.

In a transport system according to a preferred embodiment of the present invention, when the controller determines, as the standby section-withdrawal condition, that at least a predetermined number of the transport vehicles are waiting in the standby section, the controller may allocate the third transport command to at least one of the transport vehicles waiting in the standby section. For example, this configuration is able to prevent the transport vehicle from staying in the standby section due to some error occurring in the certain processing apparatus.

In a transport system according to a preferred embodiment of the present invention, the transport vehicle may travel along the track in one direction. When a plurality of the transport vehicles are waiting in the standby section, and a transport command to withdraw from the standby section is allocated to one of the transport vehicles waiting in the standby section, excluding the transport vehicle most downstream, the controller may allocate a transport command to withdraw from the standby section and transport the object to the standby section again, to another transport vehicle downstream from the one of the transport vehicles. When the controller determines, as the standby section-withdrawal condition, that the transport vehicle to which the first transport command has been allocated has withdrawn from the standby section at least a predetermined number of times, the controller may allocate the third transport command to the transport vehicle to which the first transport command has been allocated. For example, this configuration is able to prevent ejection control (control of allowing the downstream transport vehicle to withdraw from the standby section and return to the standby section again in order to withdraw the upstream transport vehicle from the standby section) from being repeated due to some trouble occurring in the certain processing apparatus.

A transport method according to a preferred embodiment of the present invention is performed in a transport system. The transport system includes a track, a plurality of transport vehicles to travel along the track and transport an object to a load port of each of a plurality of processing apparatuses, and a controller configured or programmed to communicate with each of the transport vehicles and control operation of each of the transport vehicles. The track is provided with a standby section associated with a certain one of the plurality of processing apparatuses to allow the transport vehicle to wait. The transport method includes a first step, performed by the controller, of allocating, to the transport vehicle, a first transport command to transport the object to the standby section, when determining that there exists a transport request to transport the object to a load port of the certain processing apparatus; a second step, performed by the transport vehicle to which the first transport command has been allocated, of waiting in the standby section while holding the object, when reaching the standby section; and a third step, performed by the controller, of allocating, to the transport vehicle to which the first transport command has been allocated, a second transport command to transport the object to the load port of the certain processing apparatus, when determining that the object is transportable to the load port of the certain processing apparatus, after allocating the first transport command to the transport vehicle.

This transport method decreases or prevents reduction in an operating rate of the certain processing apparatus, as in the transport system described above.

Preferred embodiments of the present invention decrease or prevent reduction in an operating rate of a certain processing apparatus.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the figures. The same or corresponding parts in the figures are denoted by the same reference signs, and an overlapping description will be omitted.

Figure 1:
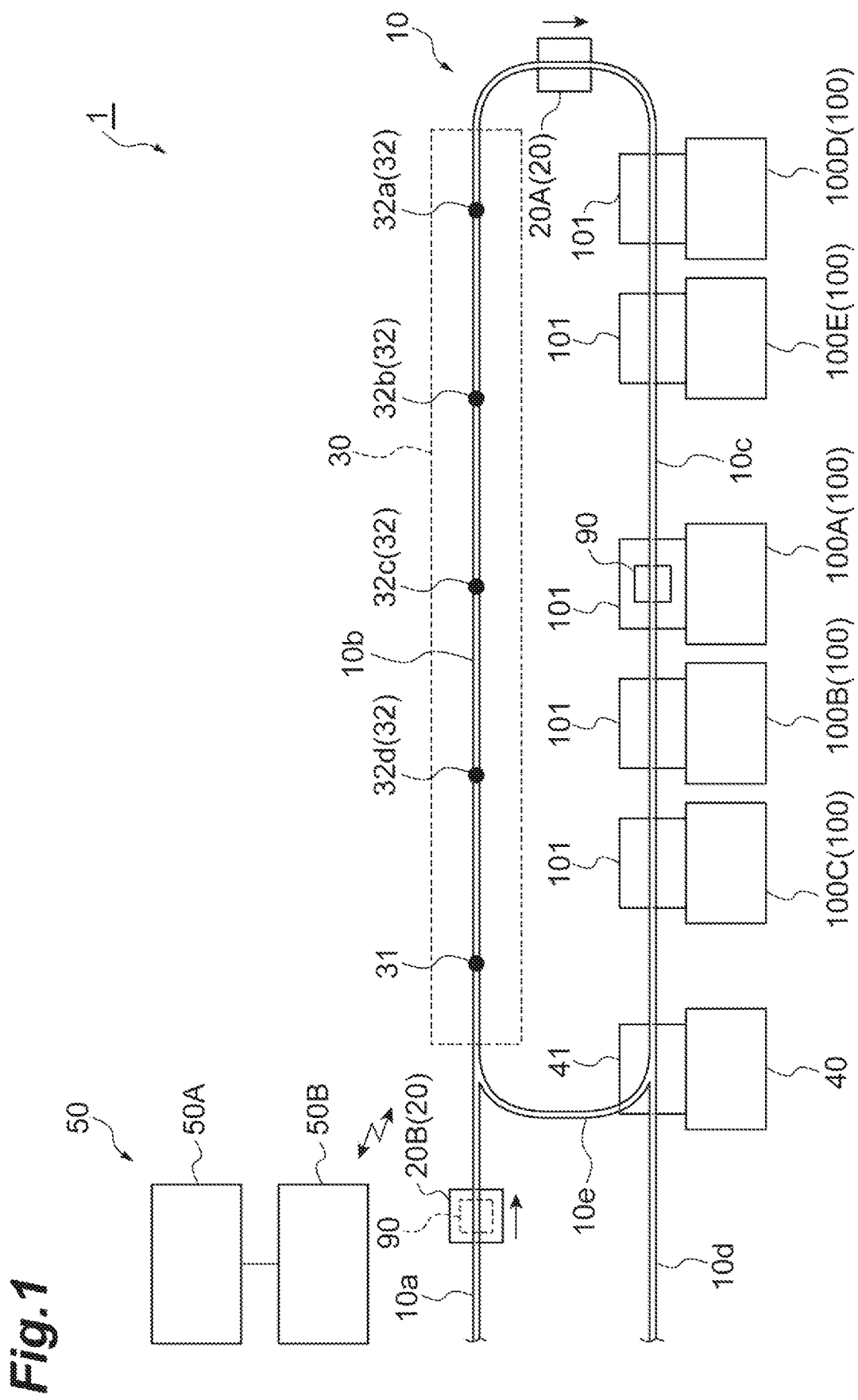
FIG. 1 is a partial plan view of a transport system according to a preferred embodiment of the present invention.

As illustrated in FIG. 1, a transport system 1 includes a track 10, a plurality of transport vehicles 20, and a controller 50. The track 10 is preferably provided in the vicinity of a ceiling of a semiconductor fabrication plant equipped with a plurality of processing apparatuses 100. The transport vehicle 20 is an overhead hoist transfer (OHT) and travels on the track 10 in one direction while being suspended from the track 10. The transport vehicle 20 transports a front opening unified pod (FOUP) 90 accommodating a plurality of semiconductor wafers as an object to a load port 101 of each processing apparatus 100. The controller 50 communicates with each transport vehicle 20 and controls the operation of each transport vehicle 20.

The track 10 includes a plurality of sections 10a, 10b, 10c, 10d, and 10e. The section 10b is linearly connected to the downstream side of the section 10a. The section 10c is curved to be bent back and connected to the downstream side of the section 10b. The section 10d is linearly connected to the downstream side of the section 10c. The section 10e branches from the connection position between the section 10c and the section 10d and merges with the connection position between the section 10a and the section 10b.

In such a track 10, the transport vehicle 20 entering through the upstream side of the section 10a travels from the section 10a to the section 10b, then travels to the section 10c, thereafter travels to the section 10d, and exits to the downstream side. Alternatively, the transport vehicle 20 entering through the upstream side of the section 10a travels from the section 10*a* to the section 10*b*, then travels to the section 10*c*, thereafter travels from the section 10*c* to the section 10*e*, and travels to the section 10*b* again. The configuration of the track 10 is illustrated only by way of example and not limitative.

The section 10*b* is provided with a standby section 30 associated with certain processing apparatuses 100A, 100B, and 100C, of a plurality of processing apparatuses 100, to allow the transport vehicle 20 to wait. In the standby section 30, a plurality of standby points 31 and 32 are set, which are positions where the transport vehicle 20 waits. In the figure, a standby point 31 set on the most upstream side of the standby section 30 and four standby points 32*a*, 32*b*, 32*c*, and 32*d* set on the downstream side of the standby point 31 are illustrated as standby points.

In the section 10*c*, a position is set to transfer a FOUP to the load port 101 of each of the certain processing apparatuses 100A, 100B, and 100C. Three certain processing apparatuses 100A, 100B, and 100C are disposed along the section 10*c* in this order from the upstream side, and the load ports 101 of certain processing apparatuses 100A, 100B, and 100C are positioned below the section 10*c*. When a FOUP 90 is placed onto the load port 101, each of the certain processing apparatuses 100A, 100B, and 100C takes in a semiconductor wafer in the FOUP and performs a predetermined process on the semiconductor wafer. Each of the certain processing apparatuses 100A, 100B, and 100C returns the semiconductor wafer subjected to a predetermined process into the FOUP 90 and sets the FOUP 90 to a state transportable by the transport vehicle 20.

The certain processing apparatuses 100A, 100B, and 100C are devices that perform a process with higher processing speed, among the processing apparatuses 100 (that is, among the processing apparatuses 100, a process that requires a shorter time to perform a predetermined process on a semiconductor wafer and set the FOUP 90 to a state transportable by the transport vehicle 20, after the FOUP 90 is placed on the load port 101). Examples of the certain processing apparatuses 100A, 100B, and 100C include testing devices and lithography devices.

In the section 10*c*, normal processing apparatuses 100D and 100E are disposed, which are processing apparatuses 100 other than the certain processing apparatuses 100A, 100B, and 100C. The normal processing apparatuses 100D and 100E are disposed along the section 10*c* in this order from the upstream side, and the load ports 101 of the normal processing apparatuses 100D and 100E are positioned below the section 10*c*. When a FOUP 90 is placed on the load port 101, each of the normal processing apparatuses 100D and 100E takes in a semiconductor wafer in the FOUP and performs a predetermined process on the semiconductor wafer. Each of the certain processing apparatuses 100A, 100B, and 100C returns the processed semiconductor wafer into the FOUP 90 and sets the FOUP 90 to a state transportable by the transport vehicle 20. The normal processing apparatuses 100D and 100E perform a process with lower processing speed than the certain processing apparatuses 100A, 100B, and 100C.

A stocker 40 is disposed in the vicinity of the connection position between the section 10*c* and the section 10*d*. The stocker 40 is a facility that temporarily stores a plurality of FOUPs 90 transported by the transport vehicles 20. The stocker includes a port 41 positioned below the connection position between the section 10*c* and the section 10*d*. When a FOUP 90 is placed onto the port 41, the stocker 40 takes in the FOUP 90 and temporarily stores the FOUP 90. When the temporarily stored FOUP 90 is to be obtained by the transport vehicle 20, the FOUP 90 is placed onto the port 41 and set to a state transportable by the transport vehicle 20. For example, a storage shelf to temporarily store an object may be used instead of the stocker 40.

The transport vehicle 20 includes a transfer mechanism to transfer a FOUP 90 to the load port 101. The transfer mechanism includes, for example, a grip to grip a FOUP 90 and an elevator mechanism to elevate and lower the grip. In this configuration, for example, the transport vehicle 20 stops at a position to transfer the FOUP 90 to the load port 101 of the certain processing apparatus 100A, and, in this state, the transfer mechanism operates to transfer the FOUP 90 to the load port 101. The transfer of the FOUP 90 to the load port 101 includes a case where the FOUP 90 held by (loaded on) the transport vehicle 20 is supplied (unloaded) to the load port 101 and a case where the transport vehicle 20 obtains (picks up) the FOUP 90 placed on the load port 101.

The controller 50 is preferably configured or programmed to include a transport controller 50A and a transport vehicle controller 50B. The transport controller 50A is a higher-level controller for the transport vehicle controller 50B. The transport controller 50A communicates with the transport vehicle controller 50B and a fabrication controller (not illustrated). The fabrication controller communicates with each processing apparatus 100 and submits to the transport controller 50A a transport request to transport a FOUP 90 to the load port 101 of each processing apparatus 100. When the transport controller 50A determines that a transport request exists, the transport vehicle controller 50B allocates a transport command corresponding to the transport request to one of the transport vehicles 20. The transport controller 50A, the transport vehicle controller 50B, and the fabrication controller preferably are each, for example, a computer device including a processor, a memory, a storage, and a communication device. In each controller, the processor executes predetermined software (program) read into a memory or the like and controls read and write of data in the memory and the storage and communication between the controllers through the communication device to implement the functions of the controller as described later.

In the transport system 1, standby control described below is performed. The standby control performed in the following situation will be described by way of example. As illustrated in FIG. 1, a FOUP 90 is placed on the load port 101 of the certain processing apparatus 100A, of three certain processing apparatuses 100A, 100B, and 100C disposed along the section 10*c*. Therefore, at this time, the certain processing apparatus 100A is not in a situation where the FOUP 90 is transportable to its load port 101. In order to obtain the FOUP 90 placed on the load port 101 of the certain processing apparatus 100A, the transport vehicle 20A is traveling through the section 10*c* toward the certain processing apparatus 100A.

In such a situation, when there exists a transport request to transport another FOUP 90 to the load port 101 of the certain processing apparatus 100A, the transport controller 50A communicates with the fabrication controller to determine that the transport request exists. Here, the transport controller 50A creates a first transport command to transport a FOUP 90 to the standby section 30. The transport controller 50A then transmits the first transport command to the transport vehicle controller 50B. The transport vehicle controller 50B receiving the first transport command allocates the first transport command to the transport vehicle 20B (first step). Specifically, the first transport command is a command that allows the transport vehicle 20B to transport a FOUP 90 to the standby point 31 in the standby section 30. The figure illustrates a state in which the transport vehicle 20B that has been allocated with the first transport command is travelling through the section 10a while holding a FOUP 90 to be transferred to the load port 101 of the certain processing apparatus 100A. Even when a FOUP 90 is not placed on the load port 101 of the certain processing apparatus 100A and the certain processing apparatus 100A is in a situation where a FOUP 90 is transportable to its load port 101, the transport vehicle controller 50B allocates, to the transport vehicle 20B, the first transport command to transport a FOUP 90 to the standby section 30.

Figure 2:
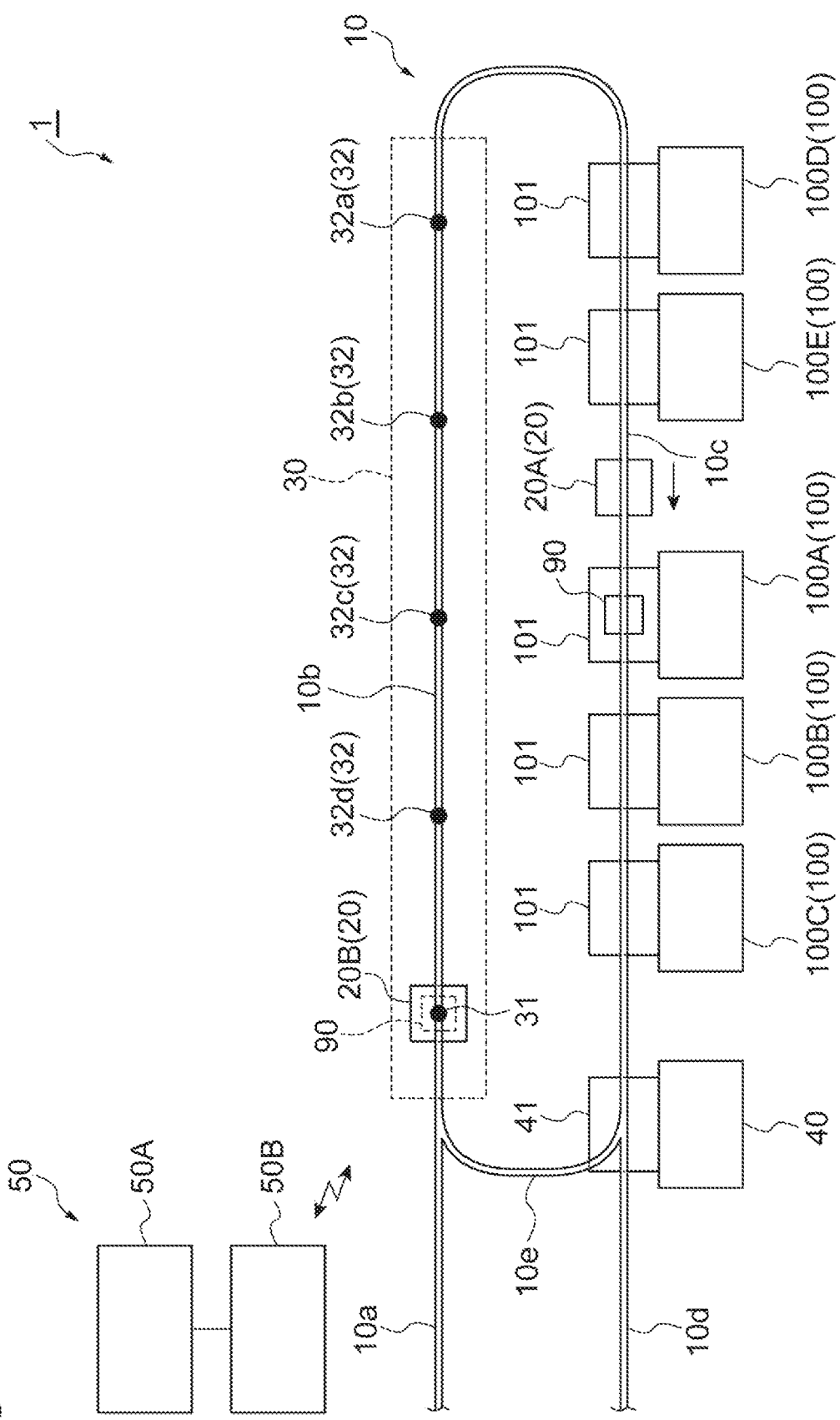
FIG. 2 is a plan view for explaining standby control in the transport system in FIG. 1.

Subsequently, as illustrated in FIG. 2, the transport vehicle 20B reaches the standby point 31, and the first transport command is completed. The transport vehicle 20B reaching the standby point 31 waits at the standby point 31 while holding the FOUP 90 (second step).

Figure 3:
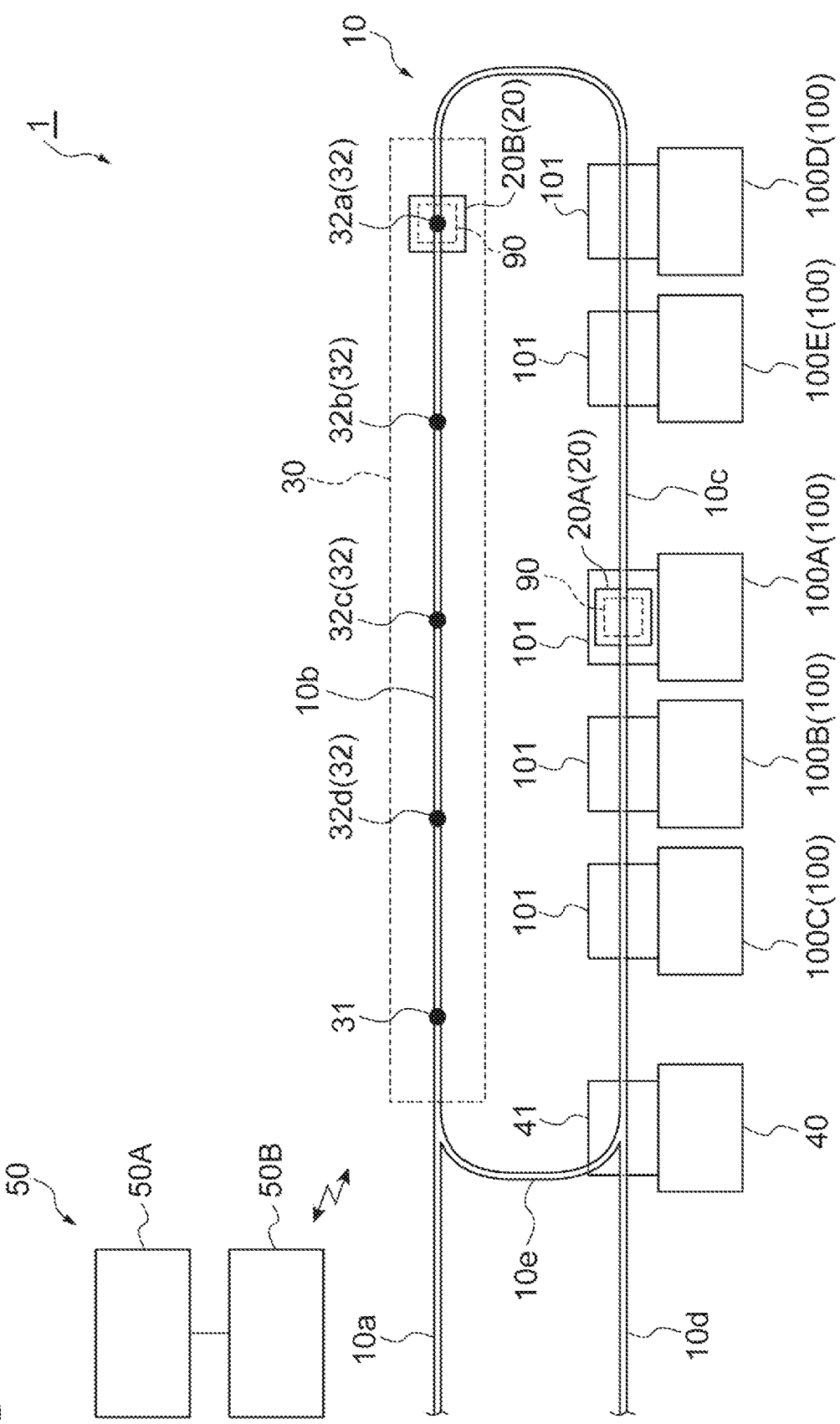
FIG. 3 is a plan view for explaining standby control in the transport system in FIG. 1.

Subsequently, as illustrated in FIG. 3, when the standby point 32 downstream from the transport vehicle 20B is vacant (that is, another transport vehicle 20 is not waiting) in the standby section 30, the transport vehicle controller 50B allocates, to the transport vehicle 20B, a move command to move to the standby point 32 on the downstream side. The figure illustrates a state in which the transport vehicle 20B, to which the move command to move to the standby point 32a has been allocated by the transport vehicle controller 50B, has been moved to the standby point 32a. The transport vehicle 20B reaching the standby point 32a waits at the standby point 32a while holding the FOUP 90.

In the figure, the transport vehicle 20A has reached a position to transfer a FOUP 90 to the load port 101 of the certain processing apparatus 100A. The transport vehicle 20A obtains the FOUP 90 placed on the load port 101 of the certain processing apparatus 100A. The certain processing apparatus 100A thus enters a state in which the FOUP 90 is transportable to its load port 101.

Figure 4:
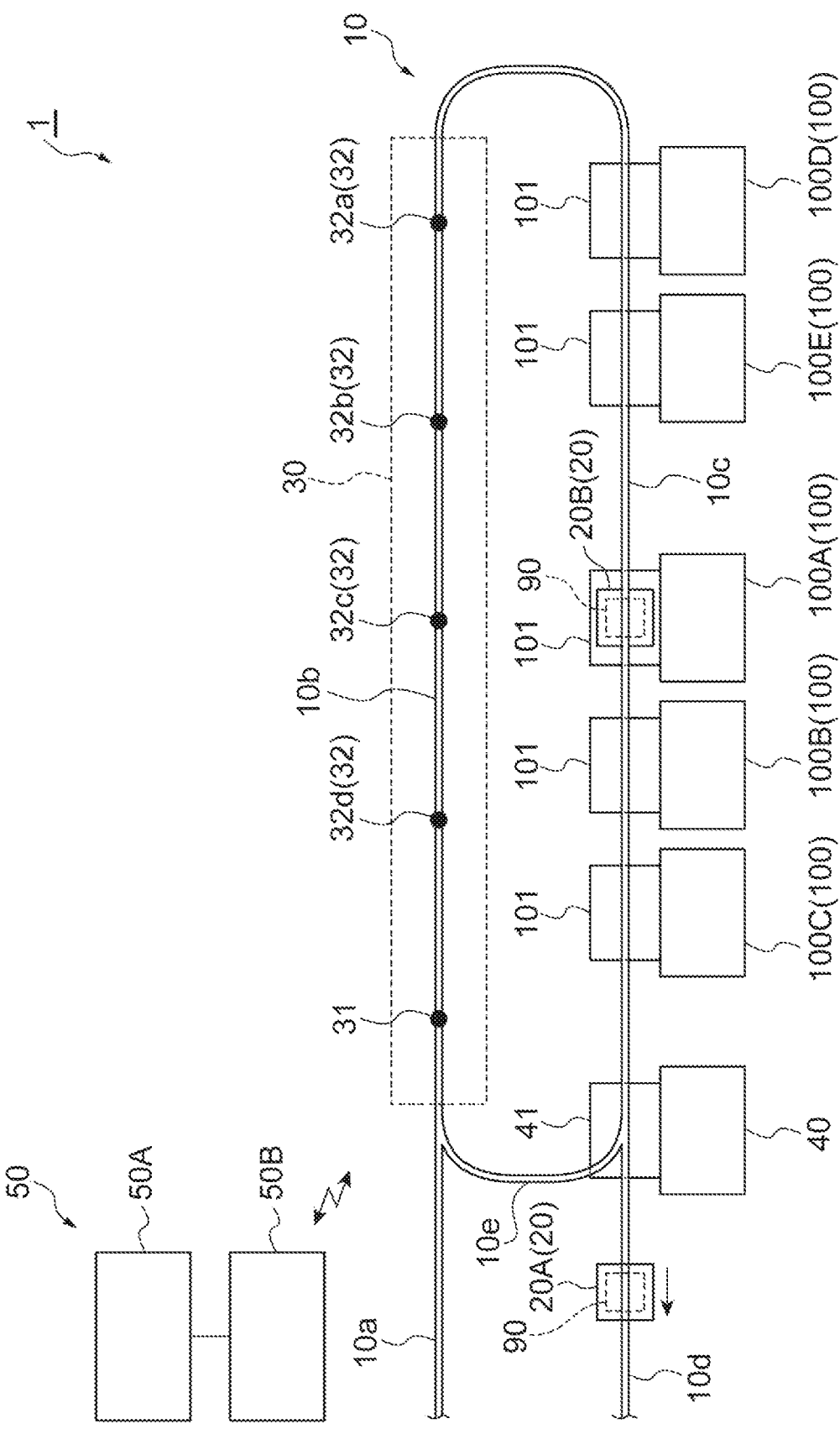
FIG. 4 is a plan view for explaining standby control in the transport system in FIG. 1.

Subsequently, as illustrated in FIG. 4, the transport controller 50A communicates with the fabrication controller to determine that a FOUP 90 is transportable to the load port 101 of the certain processing apparatus 100A. Here, the transport controller 50A creates a second transport command to transport a FOUP 90 to the load port 101 of the certain processing apparatus 100A. The transport controller 50A then transmits the second transport command to the transport vehicle controller 50B. The transport vehicle controller 50B receiving the second transport command allocates the second transport command to the transport vehicle 20B to which the first transport command has been allocated (third step). Subsequently, the transport vehicle 20B transports the FOUP 90 from the standby point 32a to the load port 101 of the certain processing apparatus 100A, and the second transport command is completed.

At this time, the transport vehicle controller 50B allows the transport vehicle 20A obtaining the FOUP 90 from the load port 101 of the certain processing apparatus 100A to travel from the position to transfer a FOUP 90 to the load port 101 to another position on the track 10.

In the transport system 1, first withdrawal control, second withdrawal control, and third withdrawal control described below preferably are performed.

Figure 5:
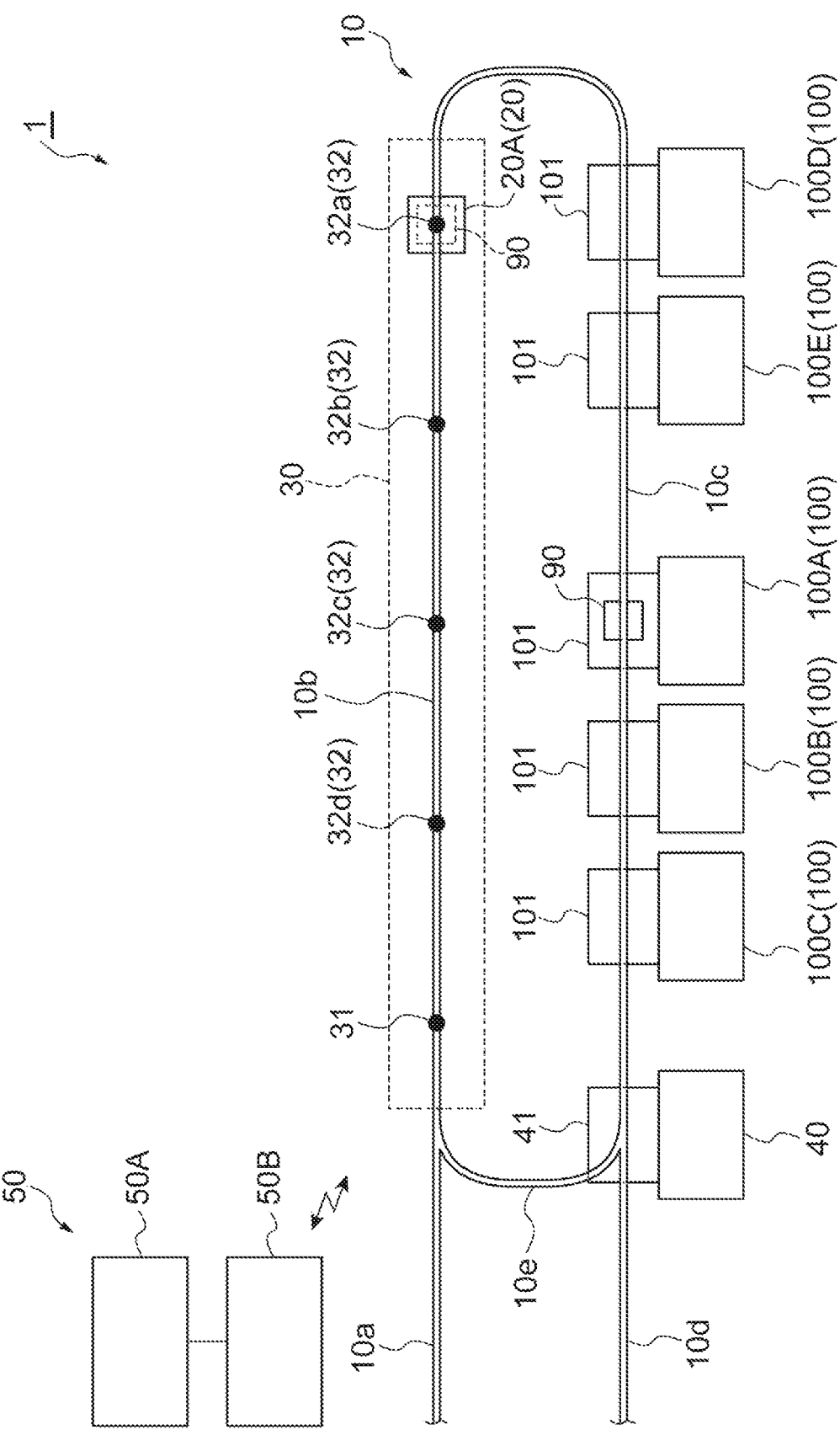
FIG. 5 is a plan view for explaining first withdrawal control in the transport system in FIG. 1.

First of all, the first withdrawal control performed in the following situation will be described by way of example. As illustrated in FIG. 5, a FOUP 90 is placed on the load port 101 of the certain processing apparatus 100A, of three certain processing apparatuses 100A, 100B, and 100C disposed along the section 10c. Therefore, at this time, the certain processing apparatus 100A is not in a situation where a FOUP 90 is transportable to its load port 101. The transport vehicle 20A to which the first transport command has been allocated and has transported the FOUP 90 to the standby section 30 waits at the standby point 32a while holding the FOUP 90 to be transported to the load port 101 of the certain processing apparatus 100A.

In such a situation, for example, when some trouble occurs in the certain processing apparatus 100A, the controller 50, or the like, the transport vehicle 20A waiting at the standby point 32a may be unable to transport the FOUP 90 to the load port 101 of the certain processing apparatus 100A and stay at the standby point 32a.

In this case, when determining that a first standby section-withdrawal condition (standby section-withdrawal condition) is satisfied, the transport controller 50A creates a third transport command to transport a FOUP 90 to a predetermined destination. The transport controller 50A then transmits a third transport command to the transport vehicle controller 50B. The transport vehicle controller 50B receiving the third transport command allocates the third transport command to the transport vehicle 20A. Here, the first standby section-withdrawal condition is satisfied when a predetermined time or longer has elapsed since the transport vehicle 20A reaches the standby section 30. Although here the predetermined destination is the stocker 40, any other destination may be set.

Figure 6:
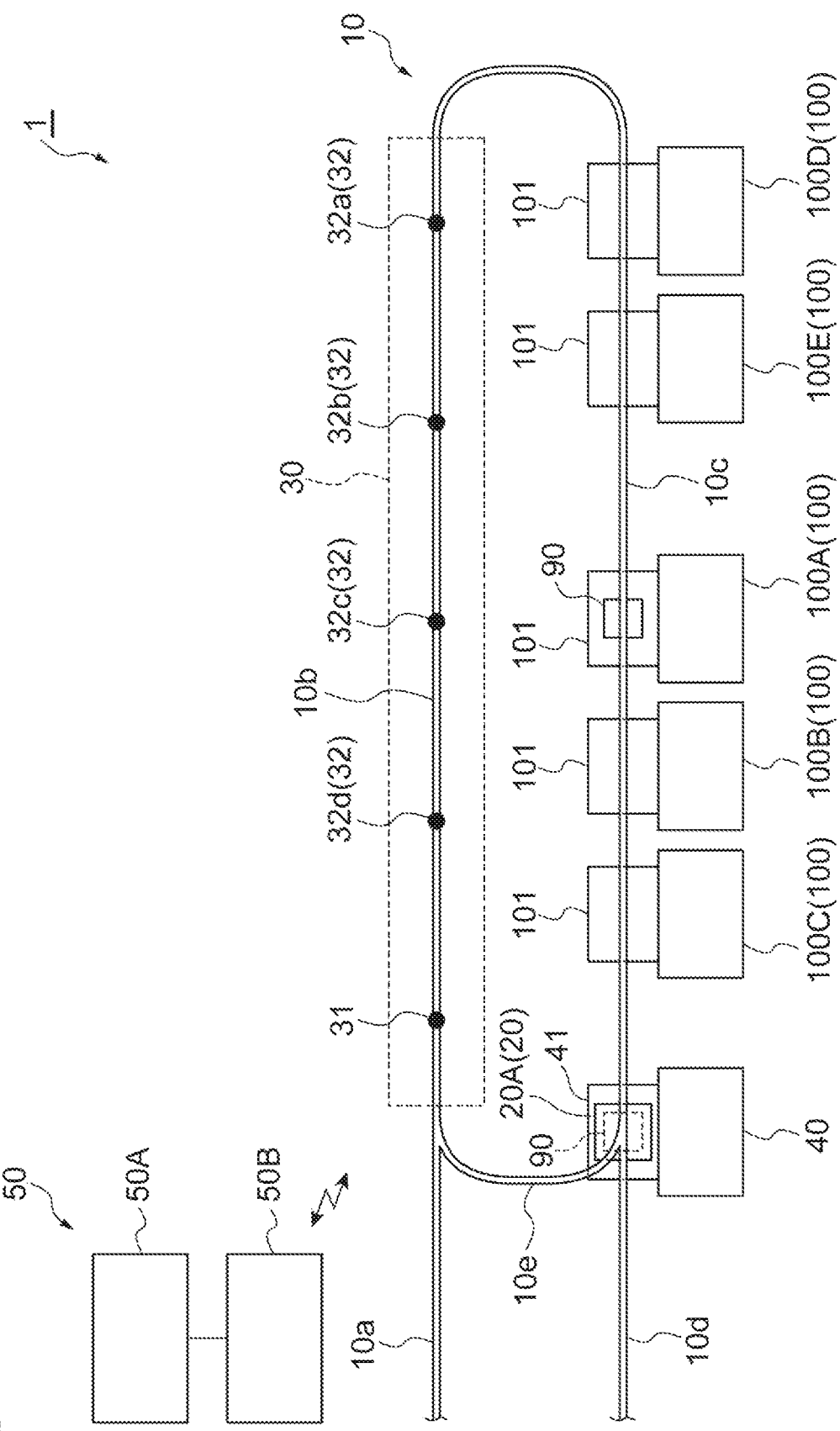
FIG. 6 is a plan view for explaining first withdrawal control in the transport system in FIG. 1.

Subsequently, as illustrated in FIG. 6, the transport vehicle 20A transports the FOUP 90 from the standby point 32a to the stocker 40, and the third transport command is completed. The first withdrawal control is thus completed.

Figure 7:
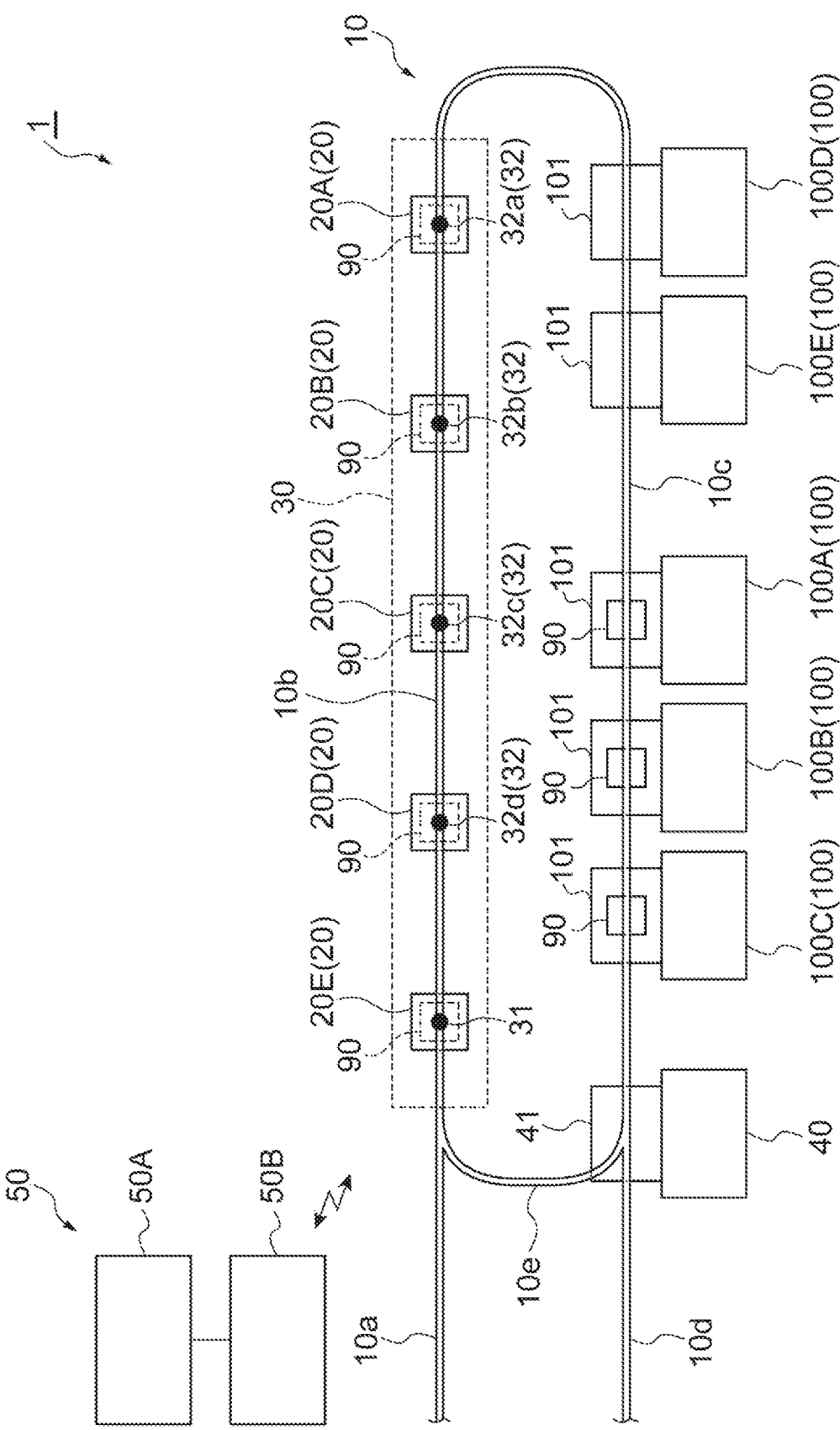
FIG. 7 is a plan view for explaining second withdrawal control in the transport system in FIG. 1.

Next, the second withdrawal control performed in the following situation will be described by way of example. As illustrated in FIG. 7, a FOUP 90 is placed on the load port 101 of each of three certain processing apparatuses 100A, 100B, and 100C disposed along the section 10c. Therefore, at this time, the certain processing apparatuses 100A, 100B, and 100C are not in a situation where FOUPs 90 are transportable to their load ports 101. The transport vehicles 20A, 20B, 20C, 20D, 20E that have been allocated the first transport command and have transported FOUPs 90 to the standby section 30 wait at the standby points 32a, 32b, 32c, 32d, and 31 while holding FOUPs 90 to be transported to the load port 101 of any of certain processing apparatuses 100A, 100B, and 100C.

In this situation, for example, when some trouble occurs in the certain processing apparatuses 100A, 100B, and 100C, the controller 50, or the like, the transport vehicles 20A, 20B, 20C, 20D, and 20E waiting at the standby points 32a, 32b, 32c, 32d, and 31 may be unable to transport FOUPs 90 to the load ports 101 of the certain processing apparatuses 100A, 100B, and 100C and stay at the standby points 32a, 32b, 32c, 32d, and 31. In such a case, a place for another new transport vehicle 20 to wait is not secured unless at least one of the transport vehicles 20A, 20B, 20C, 20D, and 20E waiting in the standby section 30 is withdrawn from the standby section 30.

In this case, the transport controller 50A creates a third transport command when determining that a second standby section-withdrawal condition (standby section-withdrawal condition) is satisfied. The transport controller 50A then transmits the third transport command to the transport vehicle controller 50B. The transport vehicle controller 50B receiving the third transport command allocates the third transport command to at least one of the transport vehicles 20A, 20B, 20C, 20D, and 20E. Here, the second standby section-withdrawal condition is satisfied when at least a predetermined number of transport vehicles 20 are waiting in the standby section 30. Although in this example, the predetermined number is five, by way of example, any number may be set.

Subsequently, at least one of the transport vehicles 20A, 20B, 20C, 20D, and 20E transports the FOUP 90 from the standby points 32a, 32b, 32c, 32d, and 31 to a predetermined destination, and the third transport command is completed. The second withdrawal control is thus completed. Although in this example, the predetermined destination is the stocker 40, any other destination may be set.

Figure 8:
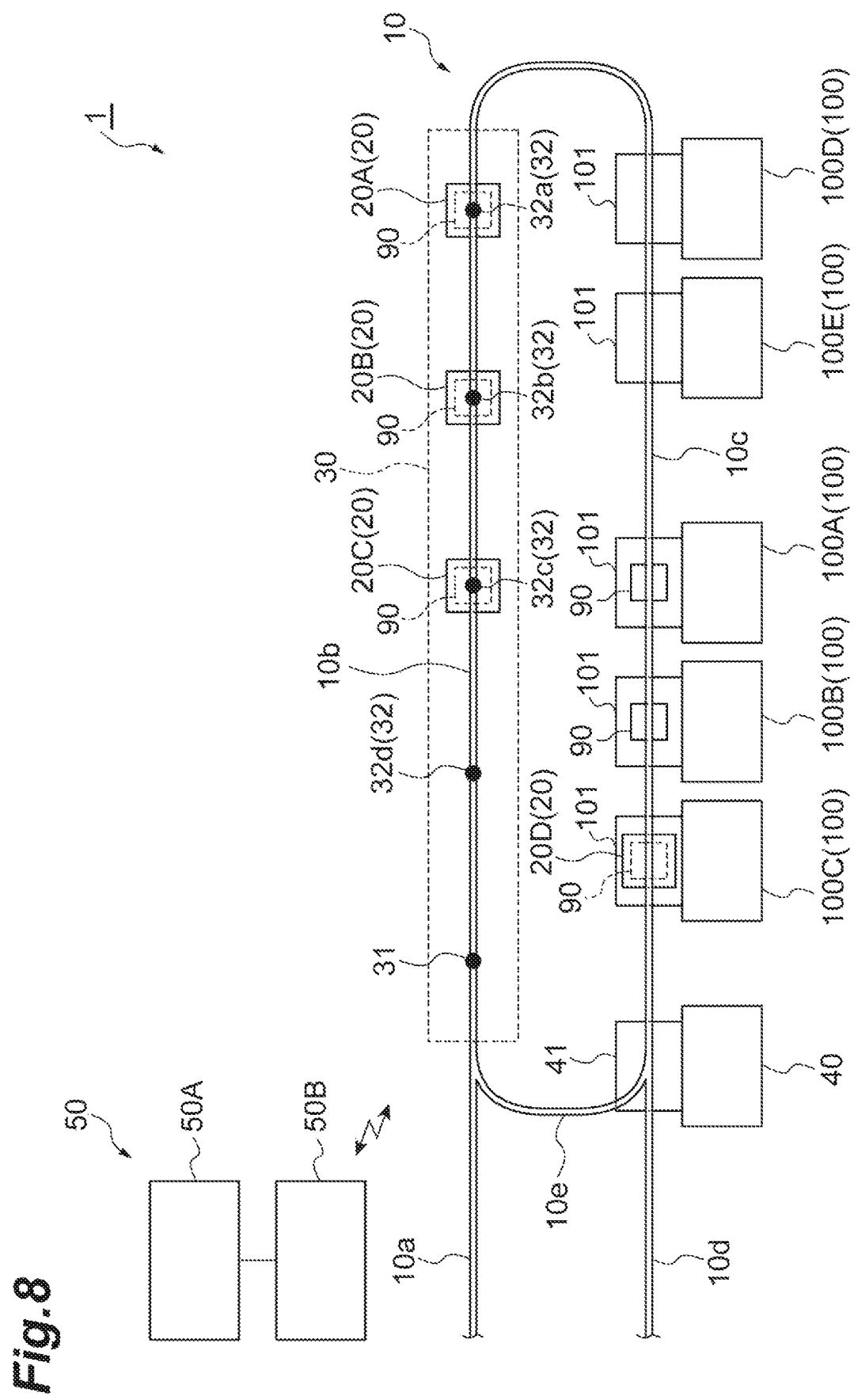
FIG. 8 is a plan view for explaining third withdrawal control in the transport system in FIG. 1.

The third withdrawal control performed in the following situation will now be described by way of example. As illustrated in FIG. 8, a FOUP 90 is placed on the load port 101 of each of three certain processing apparatuses 100A, 100B, and 100C disposed along the section 10c. Therefore, at this time, each of the certain processing apparatuses 100A, 100B, and 100C is not in a situation where a FOUP 90 is transportable to its load port 101. The transport vehicles 20A and 20B that have been allocated the first transport command and have transported FOUPs 90 to the standby section 30 wait at the standby points 32a and 32b, respectively, while holding FOUPs 90 to be transported to the load ports 101 of the certain processing apparatuses 100A and 100B. The transport vehicle 20C that has been allocated the first transport command and has transported a FOUP 90 to the standby section 30 waits at the standby point 32c while holding a FOUP 90 to be transported to the load port 101 of the certain processing apparatus 100C. Furthermore, in order to obtain the FOUP 90 placed on the load port 101 of the certain processing apparatus 100C, the transport vehicle 20D is at a position to transfer the FOUP 90 to the load port 101 of the certain processing apparatus 100C.

In such a situation, the transport vehicle 20D obtains the FOUP 90 placed on the load port 101 of the certain processing apparatus 100C. The certain processing apparatus 100C thus enters a state in which a FOUP 90 is transportable to its load port 101.

Figure 9:
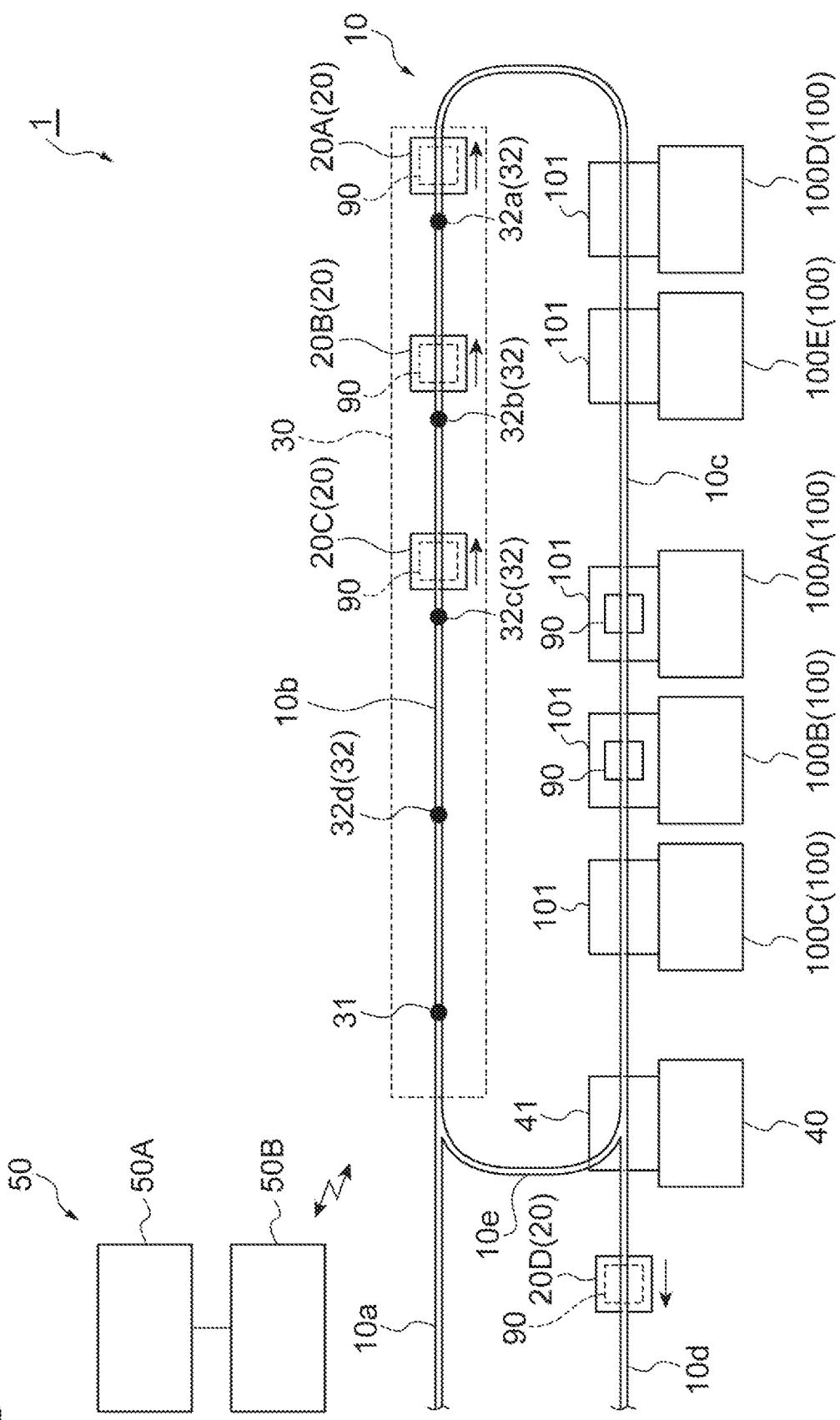
FIG. 9 is a plan view for explaining third withdrawal control in the transport system in FIG. 1.

Subsequently, as illustrated in FIG. 9, the transport controller 50A creates a transport command to withdraw from the standby section 30. The transport controller 50A then transmits the transport command to the transport vehicle controller 50B. The transport vehicle controller 50B receiving the transport command allocates the transport command to the transport vehicle 20C waiting in the standby section 30.

At this time, the transport controller 50A creates a transport command to withdraw from the standby section 30 and transport a FOUP 90 to the standby section 30 again. The transport controller 50A then transmits the transport command to the transport vehicle controller 50B. The transport vehicle controller 50B receiving the transport command allocates the transport command to the transport vehicles 20A and 20B downstream from the transport vehicle 20C (ejection control).

In the ejection control described in this example, the second transport command to transport a FOUP 90 to the load port 101 of the certain processing apparatus 100C is allocated, as the transport command to withdraw from the standby section 30, to the transport vehicle 20C. In the ejection control, the transport command to withdraw from the standby section 30 may not be the second transport command and may be, for example, a transport command under the first withdrawal control or the second withdrawal control.

In the example described here, the transport vehicle controller 50B allocates a transport command to withdraw from the standby section 30 to the transport vehicle 20C that is the most upstream transport vehicle 20 of a plurality of transport vehicles waiting in the standby section 30. However, the transport vehicle 20 to be allocated the transport command to withdraw from the standby section 30 may be any other transport vehicle 20, excluding the most downstream transport vehicle 20, of the transport vehicles 20 waiting in the standby section 30.

Subsequently, the transport vehicles 20A and 20B that have withdrawn from the standby section 30 and transported FOUPs 90 to the standby section 30 again wait in the standby section 30 while holding FOUPs 90. The transport vehicle controller 50B may allocate, to the transport vehicles 20A and 20B, again a transport command to withdraw from the standby section 30 and transport a FOUP 90 to the standby section 30 again.

In a situation where such ejection control is performed, for example, when some trouble occurs in the certain processing apparatuses 100A, 100B, the controller 50, or the like, the transport vehicles 20A and 20B waiting at the standby points 32a and 32b may be unable to transport FOUPs 90 to the load ports 101 of the certain processing apparatuses 100A and 100B and stay at the standby points 32a and 32b. Based on this, when ejection control is repeated for the same transport vehicles 20A and 20B a predetermined number of times or more, for example, some trouble may occur in the certain processing apparatuses 100A, 100B, the controller 50, or the like.

Therefore, the transport controller 50A creates a third transport command when determining that a third standby section-withdrawal condition (standby section-withdrawal condition) is satisfied. The transport controller 50A then transmits the third transport command to the transport vehicle controller 50B. The transport vehicle controller 50B receiving the third transport command allocates the third transport command to the transport vehicles 20A and 20B waiting at the standby points 32a and 32b. Here, the third standby section-withdrawal condition is satisfied when the transport vehicle 20 that has been allocated the first transport command has withdrawn from the standby section 30 a predetermined number of times or more.

Subsequently, the transport vehicles 20A and 20B transport FOUPs 90 from the standby points 32a and 32b to the stocker 40, and the third transport command is completed. The third withdrawal control is thus completed. Although here the predetermined destination is the stocker 40, any other destination may be set.

As described above, in the transport system 1 and the transport method performed in the transport system 1, even if a FOUP 90 is not transportable to the load ports 101 of the certain processing apparatuses 100A, 100B, and 100C, the transport vehicle 20 picks up a FOUP 90 and starts traveling toward the standby section 30. When the situation changes so that a FOUP 90 is transportable to the load ports 101 of certain processing apparatuses 100A, 100B, and 100C, the transport vehicle 20B travelling toward the standby section 30 or the transport vehicle 20B having reached the standby section 30 and waiting while holding a FOUP 90 is able to immediately transport the FOUP 90 to the load ports 101 of the certain processing apparatuses 100A, 100B, and 100C without the need for performing an operation, such as picking-up, again. This structure and operation decrease or prevent reduction in the operating rate of the certain processing apparatuses 100A, 100B, and 100C.

In the transport system 1, for example, even if FOUPs 90 are placed on the load ports 101 of the certain processing apparatuses 100A, 100B, and 100C in the subsequent process and thus another FOUP 90 is unable to be transported to the load ports 101 of the certain processing apparatuses 100A, 100B, and 100C, the transport vehicle 20 is able to transport another FOUP 90, for example, from the load port 101 of the processing apparatus 100 in the previous process to the standby section 30. This structure and operation reduce the time required to pick up a FOUP 90 from the load port 101 of the processing apparatus 100 in the previous process. This decreases or prevents reduction in the operating rate of the processing apparatus 100 in the previous step.

In the transport system 1, when determining that the standby section-withdrawal condition is satisfied, the transport vehicle controller 50B allocates the third transport command to transport a FOUP 90 to the stocker 40 to the transport vehicle 20 that has been allocated the first transport command. This structure and operation prevent, for example, the transport vehicle from staying in the standby section 30 due to some trouble occurring in the certain processing apparatuses 100A, 100B, and 100C.

In the transport system 1, when the transport vehicle controller 50B determines, as the first standby section-withdrawal condition, that a predetermined time or longer has elapsed since the transport vehicle 20 that has been allocated the first transport command reaches the standby section 30, the transport vehicle controller 50B allocates the third transport command to the transport vehicle 20. This prevents, for example, the transport vehicle 20 from staying in the standby section 30 due to some trouble occurring in the certain processing apparatuses 100A, 100B, and 100C.

In the transport system 1, when the transport vehicle controller 50B determines, as the second standby section-withdrawal condition, that a predetermined number or more transport vehicles 20 wait in the standby section 30, the transport vehicle controller 50B allocates the third transport command to at least one of the transport vehicles 20. This prevents, for example, the transport vehicle 20 from staying in the standby section 30 due to some trouble occurring in the certain processing apparatuses 100A, 100B, and 100C.

In the transport system 1, the transport vehicle 20 travels along the track 10 in one direction. When a plurality of transport vehicles 20 are waiting in the standby section 30, and a transport command to withdraw from the standby section 30 is allocated to one of the transport vehicles 20, excluding the most downstream transport vehicle 20, of the transport vehicles 20, the transport vehicle controller 50B allocates, to another transport vehicle 20 downstream from the transport vehicle 20, a transport command to withdraw from the standby section 30 and transport a FOUP 90 to the standby section 30. When the transport vehicle controller 50B determines, as the third standby section-withdrawal condition, that the transport vehicle 20 that has been allocated the first transport command withdraws from the standby section 30 a predetermined number of times or more, the transport vehicle controller 50B allocates the third transport command to the transport vehicle 20. This prevents, for example, ejection control from being repeated due to some trouble occurring in the certain processing apparatuses 100A, 100B, and 100C.

Although preferred embodiments of the present invention have been described above, the present invention is not limited to the foregoing preferred embodiments. For example, in the foregoing preferred embodiments, the transport vehicle 20 preferably travels along the track 10 in one direction. However, the transport vehicle 20 may travel along the track 10 bidirectionally.

In the foregoing preferred embodiments, the transport system 1 preferably includes three certain processing apparatuses 100A, 100B, and 100C in the section 10c. However, the transport system 1 may include more than three certain processing apparatuses or may include less than three (one or two) certain processing apparatuses in the section 10c.

Figure 10:
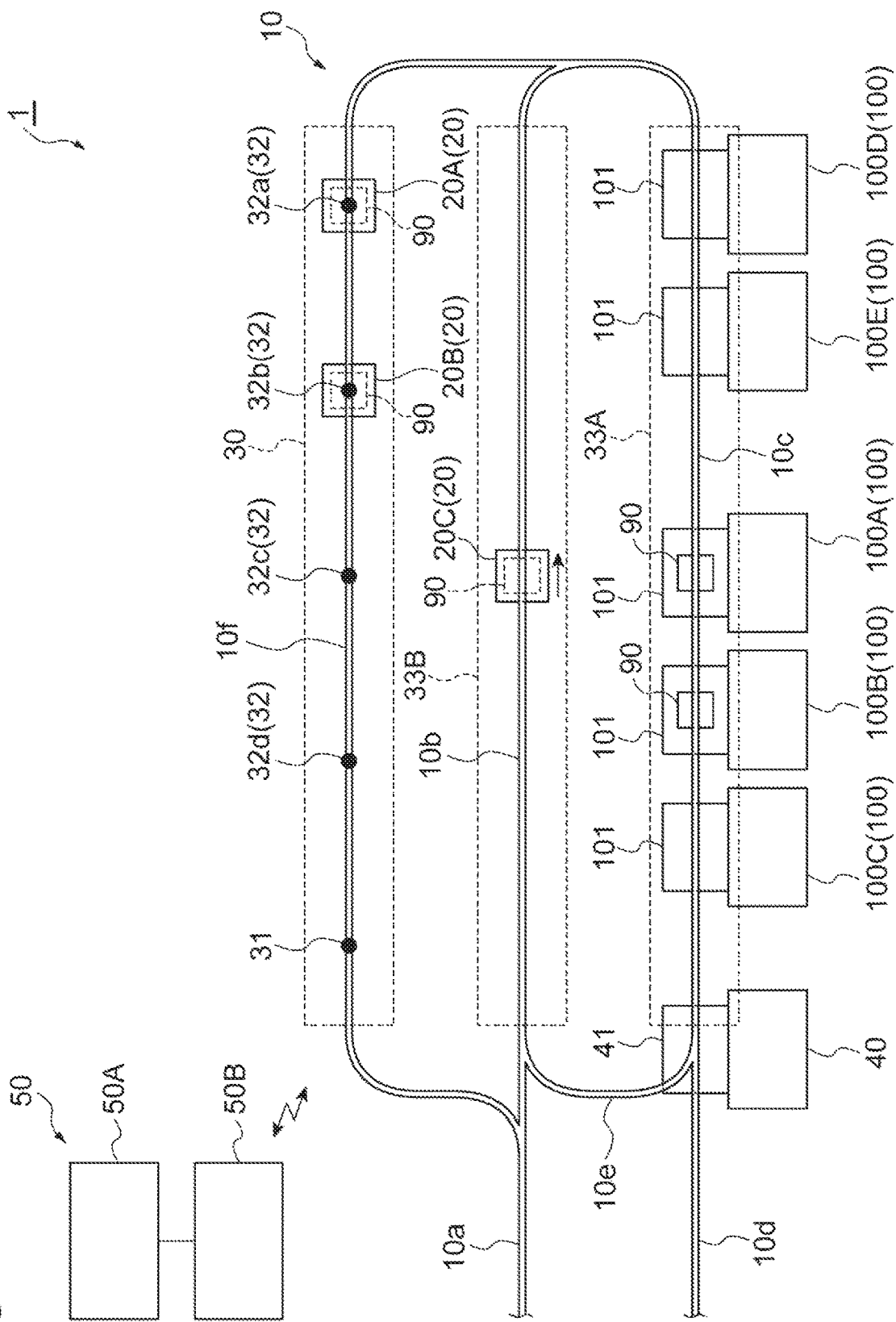
FIG. 10 is a partial plan view of the transport system according to a modification of a preferred embodiment of the present invention.

As illustrated in FIG. 10, the transport vehicle 20 may travel along the track 10 in one direction. The standby section 30 may be connected in parallel with a second travel section 33B continuous to the upstream side of a first travel section 33A including the position to transfer a FOUP 90 to the load port 101 of each of the certain processing apparatuses 100A, 100B, and 100C. In particular, one first travel section 33A may be provided for the certain processing apparatuses 100A, 100B, and 100C.

In this case, compared with the foregoing preferred embodiments, a section 10f is connected in parallel with the section 10b. That is, the section 10b corresponds to the second travel section 33B, and the section 10f corresponds to the standby section 30. Specifically, the section 10f includes an upstream side branching from the upstream side of the second travel section 33B (section 10b) and includes a downstream side merging with the downstream side of the second travel section 33B (section 10b), that is, the upstream side of the first travel section 33A (section 10c).

In such a track 10, the transport vehicle 20 entering through the upstream side of the section 10a travels from the section 10a to the section 10b and then travels to the section 10c. Alternatively, the transport vehicle 20 entering through the upstream side of the section 10a travels from the section 10a to the section 10f and then travels to the section 10c. The transport vehicle 20 traveling to the section 10c travels to the section 10d and then exits to the downstream side. Alternatively, the transport vehicle 20 traveling to the section 10c travels from the section 10c to the section 10e and travels again to the section 10b. The configuration of the track 10 in the figure is illustrated only by way of example and is not limitative.

In such a transport system 1, the transport vehicle 20 travels along the track 10 in one direction. The standby section is connected in parallel with the second travel section 33B continuous to the upstream side of the first travel section 33A including the position to transfer a FOUP 90 to the load port 101 of each of the certain processing apparatuses 100A, 100B, and 100C. This enables the transport vehicle 20 to wait in the standby section 30 without interrupting travel of the transport vehicle 20 from the second travel section 33B to the first travel section 33A.

In such a transport system 1, one first travel section 33A is provided for the certain processing apparatuses 100A, 100B, and 100C. In this configuration, since one standby section 30 is associated with the certain processing apparatuses 100A, 100B, and 100C, the area of the space necessary to provide the standby section 30 is able to be reduced.

In such a transport system 1, three certain processing apparatuses 100A, 100B, and 100C are provided in the first travel section 33A including the position to transfer a FOUP 90 to the load port 101 of each certain processing apparatus. However, the transport system 1 may include more than three certain processing apparatuses or may include less than three (one or two) certain processing apparatuses in the first travel section 33A.

In the foregoing preferred embodiments, the transport vehicle controller 50B may be configured or programmed to perform all or a portion of the functions of the transport controller 50A, or the transport controller 50A may be configured or programmed to perform all or a portion of the functions of the transport vehicle controller 50B. Alternatively, one controller 50 may be configured or programmed to perform the functions of the transport controller 50A and the transport vehicle controller 50B.

In the foregoing preferred embodiments, the object transported by the transport system 1 of the present invention is not limited to a FOUP 90 accommodating a plurality of semiconductor wafers and may be any other container accommodating glass wafers, reticles, and others. The transport systems according to preferred embodiments of the present invention are applicable to not only a semiconductor fabrication plant but also any other facilities.

In the foregoing preferred embodiments, an OHT has been illustrated as the transport vehicle 20. However, the transport vehicle 20 may not be an OHT and may be any device that can travel along the track 10 and transport an object to the load port 101 of the processing apparatus 100.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
 a track;
 a plurality of transport vehicles to travel along the track and transport an object to a load port of each of a plurality of processing apparatuses; and
 a controller configured or programmed to communicate with and control operation of each of the plurality of transport vehicles; wherein
 the track is provided with a standby section associated with a certain processing apparatus of the plurality of processing apparatuses to allow a certain transport vehicle of the plurality of transport vehicles to wait;
 when the controller determines that there exists a transport request to transport the object to a load port of the certain processing apparatus, the controller allocates, to the certain transport vehicle, a first transport command to transport the object to the standby section;
 when reaching the standby section, the certain transport vehicle to which the first transport command has been allocated waits in the standby section while holding the object;
 when the controller determines that the object is transportable to the load port of the certain processing apparatus, after allocating the first transport command to the certain transport vehicle, the controller allocates, to the certain transport vehicle to which the first transport command has been allocated, a second transport command to transport the object to the load port of the certain processing apparatus; and
 when the controller determines that a standby section-withdrawal condition is satisfied, the controller allocates, to the certain transport vehicle to which the first transport command has been allocated, a third transport command to transport the object to a predetermined destination.

2. The transport system according to claim 1, wherein
 the certain transport vehicle travels along the track in one direction; and
 the standby section is connected in parallel with a second travel section continuous with an upstream side of a first travel section including a position to transfer the object to the load port of the certain processing apparatus.

3. The transport system according to claim 2, wherein the first travel section is provided for a plurality of the certain processing apparatuses.

4. The transport system according to claim 1, wherein when the controller determines, as the standby section-withdrawal condition, that at least a predetermined time has elapsed since the certain transport vehicle to which the first transport command has been allocated reaches the standby section, the controller allocates the third transport command to the certain transport vehicle to which the first transport command has been allocated.

5. The transport system according to claim 1, wherein when the controller determines, as the standby section-withdrawal condition, that at least a predetermined number of the transport vehicles are waiting in the standby section, the controller allocates the third transport command to at least one of the transport vehicles waiting in the standby section.

6. The transport system according to claim 1, wherein
 the certain transport vehicle travels along the track in one direction;
 when at least two of the plurality of the transport vehicles are waiting in the standby section, and a transport command to withdraw from the standby section is allocated to a specific one of the at least two of the plurality of transport vehicles waiting in the standby section, excluding a most downstream transport vehicle, the controller allocates a transport command to withdraw from the standby section and transport the object to the standby section again, to another transport vehicle downstream from the specific one of the transport vehicles; and
 when the controller determines, as the standby section-withdrawal condition, that the certain transport vehicle to which the first transport command has been allocated has withdrawn from the standby section at least a predetermined number of times, the controller allocates the third transport command to the certain transport vehicle to which the first transport command has been allocated.

7. A transport method performed in a transport system including a track, a plurality of transport vehicles to travel along the track and transport an object to a load port of each of a plurality of processing apparatuses, and a controller configured or programmed to communicate with each of the plurality of transport vehicles and control operation of each of the plurality of transport vehicles, the track being provided with a standby section associated with a certain processing apparatus of the plurality of processing apparatuses to allow a certain transport vehicle of the plurality of transport vehicles to wait, the transport method comprising:
 the controller allocating to the certain transport vehicle a first transport command to transport the object to the standby section when determining that there exists a transport request to transport the object to a load port of the certain processing apparatus;
 the certain transport vehicle to which the first transport command has been allocated waiting in the standby section while holding the object when reaching the standby section; and
 the controller allocating to the certain transport vehicle to which the first transport command has been allocated a second transport command to transport the object to the load port of the certain processing apparatus, when determining that the object is transportable to the load port of the certain processing apparatus, after allocating the first transport command to the certain transport vehicle, wherein when the controller determines that a standby section-withdrawal condition is satisfied, the controller allocates, to the certain transport vehicle to which the first transport command has been allocated, a third transport command to transport the object to a predetermined destination.

* * * * *